United States Patent [19]

Verspui et al.

[11] Patent Number: 5,164,230
[45] Date of Patent: Nov. 17, 1992

[54] METHOD OF APPLYING A BORON LAYER TO A STEEL SUBSTRATE BY A CVD PROCESS

[75] Inventors: Gerrit Verspui, Eindhoven; Jacobus M. M. Verheijen, Nijmegen; André Sikkema, Eindhoven, all of Netherlands

[73] Assignee: U.S. Philips Corporation, New York, N.Y.

[21] Appl. No.: 610,190

[22] Filed: Nov. 7, 1990

[30] Foreign Application Priority Data

Nov. 8, 1989 [NL] Netherlands ............... 8902760

[51] Int. Cl.⁵ .............................. C23C 16/06
[52] U.S. Cl. ...................... 427/250; 204/192.15; 427/405; 428/621; 428/653; 428/938
[58] Field of Search ............. 427/39, 250, 255.2, 427/328, 405, 38; 204/192.1, 192.11, 192.15, 192.16, 192.31; 428/615, 621, 653, 938

[56] References Cited

U.S. PATENT DOCUMENTS

| | | | |
|---|---|---|---|
| 3,812,563 | 5/1974 | Toaz | 419/6 |
| 4,724,169 | 2/1988 | Keem et al. | 427/249 |
| 4,731,302 | 3/1988 | Weissmantel et al. | 428/699 |
| 4,919,773 | 4/1990 | Naik | 427/419.7 |
| 4,963,423 | 10/1990 | Sekiguchi et al. | 427/99 |
| 5,035,949 | 7/1991 | Shepard et al. | 427/34 |

FOREIGN PATENT DOCUMENTS

| | | | |
|---|---|---|---|
| 55-122850 | 9/1980 | Japan | 427/405 |
| 58-133368 | 8/1983 | Japan | 427/34 |
| 61-87866 | 5/1986 | Japan | 427/250 |
| 61-130482 | 6/1986 | Japan | 428/653 |
| 63-20448 | 1/1988 | Japan | 427/250 |
| 63-79952 | 4/1988 | Japan | 427/250 |
| 1-177373 | 7/1989 | Japan | 204/192.16 |

OTHER PUBLICATIONS

Perry, Robert H., "Engineering Manual", McGraw-Hill, New York (2d. ed. 1967) pp. 3-62, 3-63, 3-78, and 3-79.
Metals Handbook, Ninth Edition, vol. 7, Powder Metallurgy, American Society for Metals, Metals Park, Ohio (1984) p. 812.

Primary Examiner—Shrive Beck
Assistant Examiner—Terry J. Owens
Attorney, Agent, or Firm—Norman N. Spain

[57] ABSTRACT

A steel substrate is provided first with an aluminum intermediate layer and then, by a CVD process, with an outer layer of boron.

13 Claims, 1 Drawing Sheet

METHOD OF APPLYING A BORON LAYER TO A STEEL SUBSTRATE BY A CVD PROCESS

BACKGROUND OF THE INVENTION

The invention relates to a method of applying a boron layer to a steel substrate by means of a CVD process.

The invention also relates to a tool manufactured from steel and provided with a boron layer.

CVD (chemical vapor deposition) is a method of coating surfaces. A known application of this method is the provision of protective coatings on metal surfaces to render said surfaces resistant to, for example, wear, erosion, corrosion and/or oxidation. In a CVD process a solid substance is deposited on a (usually) heated substrate surface as a result of one or more chemical reactions in the gas phase. These reactions may occur on or near the substrate surface. The solid substance formed deposits on the surface of the substrate as a coating. CVD is a versatile method of applying coatings of metals and alloys, the composition, structure, grain size and purity of the coatings being adjustable. CVD is particularly suitable for applying coatings having a uniform layer thickness on objects having a complex shape. Known examples of coatings are nitrides, oxides, carbides and borides such as TiN, $Al_2O_3$, SiC and $TiB_2$. Elements such as boron (B) also can be provided on a substrate by means of CVD.

A method of the type mentioned in the opening paragraph is known from C. F. Powell et al., Vapor Deposition (John Wiley, New York, 1966) pages 349-350. Boron has a number of attractive properties such as a high degree of hardness, a high melting point, a high resistance to wear and a satisfactory chemical resistance. For this reason, boron is a suitable choice for a wear-resistant coating on various steel tools. Since boron can be deposited from, for example, gaseous diborane, the reaction temperature during the CVD process can be kept below 500° C. In this manner, degradation of mechanical properties of the steel substrate can be prevented. The provision of borides, carbides and nitrides on a substrate by means of a CVD process requires a process temperature of 1000° C. or higher, which will adversely affect the mechanical properties of the steel substrate.

DETAILED DESCRIPTION OF THE INVENTION

Figure 1:
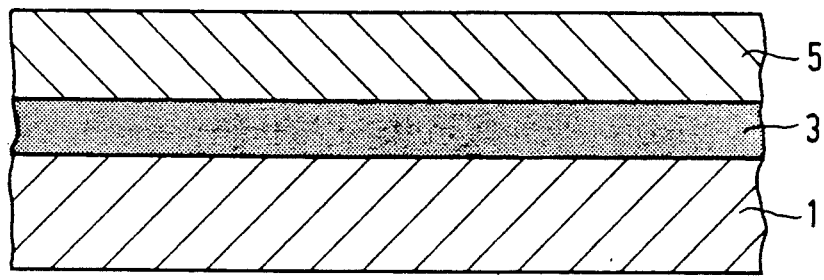
FIG. 1 is a diagrammatic sectional view of a steel substrate provided with an intermediate aluminum layer and an outer boron layer.

A disadvantage of the known method is the poor adhesion of the deposited boron layer on the steel substrate as a result of the relatively low reaction temperature. A steel tool coated with such a poorly adhering boron layer is unfit for many applications.

SUMMARY OF THE INVENTION

One of the objects of the invention is to provide a method of applying a boron layer to a steel substrate by means of a CVD process, thereby obviating the above-mentioned disadvantage.

According to the invention, this object is achieved by a method as described in the opening paragraph, characterized in that aluminum is used as an intermediate layer. The choice of aluminum as the intermediate layer is the steel-boron system is not self-evident when the material properties relevant to adhesion phenomena, namely the coefficient of thermal expansion $\alpha$ and the modulus of elasticity E, are taken into account. This is shown in Table I.

TABLE I

| Material | $\alpha (\times 10^6 K^{-1})$ | $E(kN/mm^2)$ |
|---|---|---|
| steel M2 | 12 | 250 |
| Al | 23 | 70 |
| B | 8.3 | 490 |

In Table 1, M2 is a "high speed" tool steel and comprises besides iron, 0.9% of C, 6% of W, 2% of V, 5% of Mo and 3% of Cr. The difference in coefficient of thermal expansion causes tensile stresses at the interface M2-Al and compressive stresses at the interface Al-B. Moreover, there is a discrepancy between the moduli of elasticity, which adversely affects the adhesion because the stresses increase according as the difference between the moduli of elasticity increases. Despite these unfavourable material properties aluminum appears to be a satisfactory adhesion-improving agent for boron on steel. Steel is to be understood to mean in this connection, low and high alloy types of steel and iron.

A suitable embodiment of the method according to the invention is characterized in that the aluminum intermediate layer has a thickness of at least 100 nm. Aluminum layers which are thinner than 100 nm and which are provided by means of sputtering or vapor deposition are often porous, as a result of which no optimum adhesion is obtained. The best results are obtained with an aluminum intermediate layer having a thickness between 300 and 500 nm. An aluminum intermediate layer which is too thick generally leads to a reduction of the adhesion. Moreover, the hardness of the system of B-Al-steel is reduced.

The aluminum intermediate layer can be provided by means of sputtering, all known sputtering techniques such as DC, RF and magnetron sputtering being suitable. The aluminum layer can alternatively be provided by means of vapour deposition.

According to a further known method, aluminum is provided by means of electroplating which consists in depositing an aluminum layer from an organic solvent in which an aluminum compound is dissolved.

Another suitable method of providing the aluminum intermediate layer is the CVD method. In this case, a reactant suitable for the deposition of aluminum is triisobutyl aluminum which can deposit aluminum at a temperature of 400° C. In particular for complexly formed substrate surfaces the CVD method is suitable to obtain uniform layer thicknesses.

A suitable embodiment of the method according to the invention is characterized in that the layer thickness of the boron layer is at least 7 $\mu$m. The adhesion gradually increases according as the layer thickness of the boron layer increases, and the adhesion remains constant from a layer thickness of approximately 7 $\mu$m.

An embodiment of the method according to the invention is characterized in that diborane ($B_2H_6$) is used as a gaseous boron compound in the CVD process. As described above, this enables a boron layer to be deposited on a substrate at a relatively low temperature of approximately 400° C. X-ray diffraction analysis of the boron layer applied shows that this layer is amorphous.

According to another aspect of the invention, a tool manufactured from steel is provided with a boron layer that adheres very well to the steel substrate.

According to this aspect of the invention, this tool is further characterized in that an aluminum layer having a thickness between 300 and 500 nm is present between the steel and the boron layer. As described above, boron is an element having a high hardness, a high resistance to wear and a satisfactory chemical resistance. The aluminum intermediate layer provides excellent adhesion between the steel substrate and the boron layer. An aluminum layer having a thickness between 300 and 500 nm is found to be optimal. A larger thickness of the aluminum layer has a negative effect on the hardness of the system of B-Al-steel. A thickness of the aluminum layer smaller than 300 nm generally leads to a decrease the adhesion.

It is noted that the use of an aluminum intermediate layer between a steel watchcase and a metal boride layer is known from Swiss Patent Specification CH 600407. The aluminum is provided by a CVD process at a temperature of at least 850° C. Owing to this high temperature the mechanical properties of the steel substrate are adversely affected. Consequently, this method is unsuitable for the application of a boron layer on tools.

The method according to the invention is very suitable for the application of a hard, wear-resistant, chemically resistant and properly adhering boron layer on steel tools such as, for example, moulds.

The invention will be explained in greater detail by means of the following exemplary embodiments and with reference to the accompanying drawings.

Figure 2:
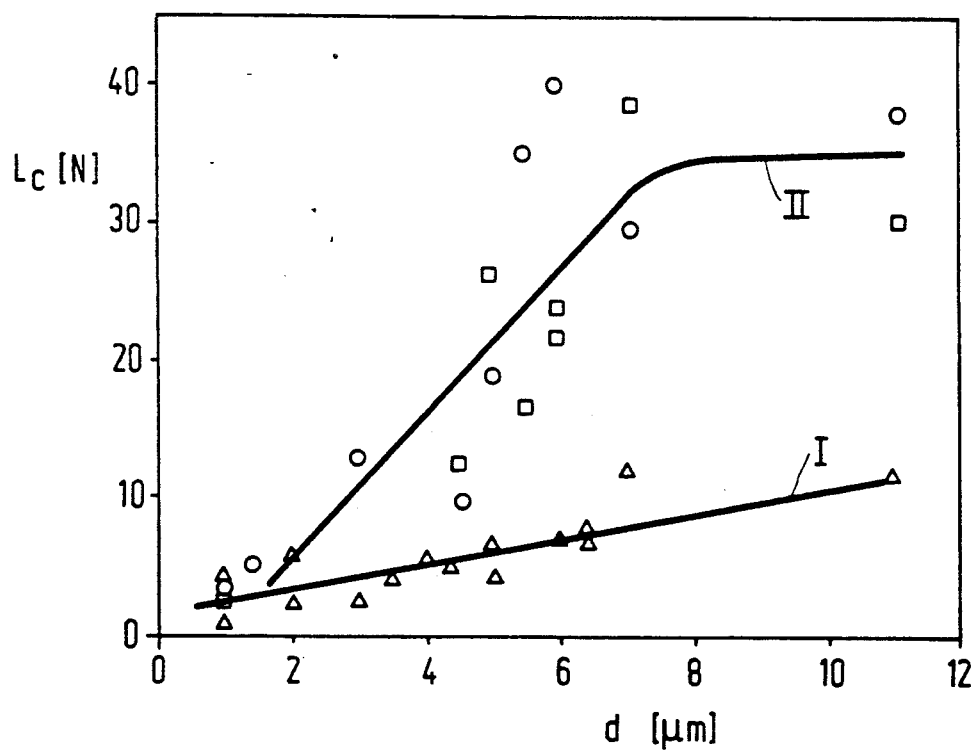
FIG. 2 is a graph showing the relation between the critical load IC and the thickness of the boron layer measured with and without the presence of an aluminum intermediate layer.

FIG. 1 is a diagrammatic sectional view of a steel substrate, an aluminum intermediate layer and a boron layer, and FIG. 2 shows the relationship between the critical load $L_c$ and the thickness d of the boron layer measured without aluminium intermediate layer (I) and with aluminium intermediate layer (II).

Exemplary Embodiment 1

Steel substrates of M2 "high speed" tool steel having a diameter of 20 mm and a thickness of 4 mm are ground at one surface to a surface roughness $R_a \leq 0.1$ μm. These ground surfaces are each provided with an aluminum layer having a thickness of 10, 50, 100, 300 and 500 nm, respectively, in a DC magnetron sputtering device by means of an aluminum target. Before these aluminum layers are provided with a boron layer, they are purified by, in succession cleaning with acetone, ultrasonic purification in acetone for 15 minutes and drying in nitrogen.

Deposition of the boron layer takes place in a low-pressure, hot-wall tubular reactor (manufactured by Tempress). The substrates are introduced into said reactor after which they are heated in a hydrogen atmosphere to a temperature of 400° C. Boron layers are obtained by introducing a mixture of diborane and hydrogen (5 vol. % $B_2H_6$) into the reactor at a flow rate of 500 sccm. Deposition of the boron layers takes place at 400° C. and an overall pressure of 2 mbar. Under these conditions the deposition rate is 2.5 μm per hour. Boron layers having thickness between 1 and 11 μm are applied.

The adhesion of the applied boron layer is measured using a scratch testing device (by Laboratoire Suisse de Recherches Horlogères). This device comprises a Rockwell C diamond stylus having a tip with a radius of 200 μm. The load is linearly increased by 10N per mm to a maximum of 60N. The minimum load at which the boron layer is detached from the substrate is called the critical load $L_c$. This $L_c$ value is determined by means of an optical microscope.

The microhardness of the boron layer applied is determined by means of a Leco DM-400 FT hardness gauge having a Knoop diamond indentor. The tip used is pressed on the boron layer for 15 seconds at a load which is selected such that the depth of penetration is maximally 10% of the thickness of the boron layer.

The layer thickness are measured by means of optical microscopy or scanning electron microscopy.

In FIG. 1, reference numeral 1 diagrammatically represents a steel substrate. An aluminum intermediate layer 3 and a boron layer 5 are applied to said substrate.

In FIG. 2, the critical load $L_c$ is plotted as a function of the thickness d of the boron layer. The measured values indicated by a triangle (Δ) relate to samples which do not contain an aluminum intermediate layer. These values are situated around the curve I. The samples which comprise an aluminum intermediate layer having a layer thickness of 10, 50 and 100 nm, respectively, also have values situated around this line I. An increase of the thickness d of the boron layer brings about an increase of the critical load $L_c$. This is caused by the fact that for a certain coating-substrate configuration the adhesion is always the same, so that thicker coatings require a higher $L_c$ value to obtain the same degree of deformation at the coating-substrate interface. In FIG. 2, a circle (O) denotes measured values of samples having an aluminum intermediate layer with a thickness of 300 nm; a square (□) denotes measured values of samples having an aluminum intermediate layer with a thickness of 500 nm. These values are situated around the curve II. In these cases, an increase in $L_c$ values of up to 40N is observed. At a thickness of the boron layer of 6 to 7 μm a strong increase of the $L_c$ value takes place when aluminum intermediate layers having thicknesses of 300 and 500 nm are used. At larger thicknesses of the boron layers the adhesion remains at a constant value of 40N. An increase of the thickness of the aluminum layer from 300 to 500 nm does not lead to a further increase of the adhesion.

Knoop hardness measurements are listed in table II. The measurements are carried out using samples having a boron-layer thickness of 6 μm. The hardness is measured at a load of 50 gr. As shown in this table, the soft aluminum intermediate layer has no influence on the hardness measured.

TABLE II

| layer thickness Al (nm) | hardness (kg/mm$^2$) |
| --- | --- |
| 0 | 2184 |
| 10 | 2298 |
| 50 | 2296 |
| 100 | 1980 |
| 300 | 2186 |
| 500 | 2185 |

X-ray diffraction analysis shows that the boron layers formed are amorphous.

Exemplary Embodiment 2

Exemplary embodiment 1 is repeated using substrates of 1C45 steel. This type of steel comprises 0.45% of C in addition to iron. The $L_c$ values obtained are the same as those obtained with M2 steel.

We claim:

1. In a method of applying a boron layer on a steel substrate by a CVD (chemical vapor deposition) process, the improvement comprising, prior to the formation of the boron layer, applying an intermediate aluminum layer to the steel substrate.

2. A method as claimed in claim 1, characterized in that the aluminum intermediate layer has a thickness of at least 100 nm.

3. A method as claimed in claim 1, characterized in that the aluminum intermediate layer has a thickness between 300 and 500 nm.

4. A method as claimed in claim 1, characterized in that the aluminum intermediate layer is applied by means of sputtering.

5. A method as claimed in claim 1, characterized in that the aluminum intermediate layer is applied by means of a CVD process.

6. A method as claimed in claim 5, characterized in that tri-isobutyl aluminum is used as a gaseous aluminum compound in the CVD process in which the aluminum intermediate layer is applied.

7. A method as claimed in claim 1, characterized in that the layer thickness of the boron layer is at least 7 $\mu$m.

8. A method as claimed in claim 1, characterized in that diborane is used as a gaseous boron compound in the CVD process.

9. A method as claimed in claim 2, characterized in that the aluminum intermediate layer is applied by means of sputtering.

10. A method as claimed in claim 2, characterized in that the aluminum intermediate layer is applied by means of a CVD process.

11. A method as claimed in claim 10, characterized in that tri-isobutyl aluminum is used as a gaseous aluminum compound in the CVD process in which the aluminum intermediate layer is applied.

12. A method as claimed in claim 2, characterized in that the layer thickness of the boron layer is at least 7 $\mu$m.

13. A method as claimed in claim 2, characterized in that diborane is used as a gaseous boron compound in the CVD process.

* * * * *